US012580575B2

(12) United States Patent
Singh et al.

(10) Patent No.: US 12,580,575 B2
(45) Date of Patent: *Mar. 17, 2026

(54) SUCCESSIVE APPROXIMATION REGISTER ANALOG TO DIGITAL CONVERTER WITH REDUCED DATA PATH LATENCY

(71) Applicant: Avago Technologies International Sales Pte. Limited, Singapore (SG)

(72) Inventors: Ullas Singh, Irvine, CA (US); Namik Kocaman, Irvine, CA (US); Mohammadamin Torabi, Mission Viejo, CA (US); Meisam Honarvar Nazari, Irvine, CA (US); Mehmet Batuhan Dayanik, Irvine, CA (US); Delong Cui, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 92 days.

This patent is subject to a terminal disclaimer.

(21) Appl. No.: 18/522,698

(22) Filed: Nov. 29, 2023

(65) Prior Publication Data

US 2024/0097692 A1 Mar. 21, 2024

Related U.S. Application Data

(63) Continuation of application No. 17/699,678, filed on Mar. 21, 2022, now Pat. No. 11,863,198.

(51) Int. Cl.
H03M 1/06 (2006.01)

(52) U.S. Cl.
CPC ....... H03M 1/0697 (2013.01); H03M 1/0678 (2013.01)

(58) Field of Classification Search
CPC .......................... H03M 1/0678; H03M 1/0697
See application file for complete search history.

(56) References Cited

U.S. PATENT DOCUMENTS 5,589,832 A * 12/1996 Grundvig ............ H03M 1/0697
341/161
6,144,331 A * 11/2000 Jiang ................... H03M 1/0682
341/172

(Continued)

OTHER PUBLICATIONS

H. Park et al., "A 4.63pJ/b 112Gb/s DSP-Based PAM-4 Transceiver for a Large-Scale Switch in 5nm FinFET," 2023 IEEE International Solid-State Circuits Conference (ISSCC), San Francisco, CA, USA, 2023, pp. 110-112, doi: 10.1109/ISSCC42615.2023.10067613.

(Continued)

*Primary Examiner* — Lam T Mai
(74) *Attorney, Agent, or Firm* — Foley & Lardner LLP

(57) ABSTRACT

Systems and methods are related to a successive approximation analog to digital converter (SAR ADC). The SAR ADC includes a sample and digital to analog conversion (DAC) circuit configured to sample an input voltage, a comparator circuit coupled to the sample and DAC circuit and having an output, a first set of storage circuits, and a comparator driver. The comparator driver is disposed between the output and the first set of storage circuits. The first set of storage circuits are coupled to the comparator circuit and the sample and DAC circuit. The comparator driver can include a first driver and second driver. The first driver is coupled to a first input of a first storage circuit of the first set of storage circuits, and the second driver is coupled to first inputs of a second set of storage circuits within the first set of storage circuits.

20 Claims, 10 Drawing Sheets

(56) References Cited

U.S. PATENT DOCUMENTS

| 8,264,268 | B2 | 9/2012 | Cho et al. | |
| 8,957,802 | B1 | 2/2015 | Evans | |
| 9,379,726 | B1 | 6/2016 | Wang et al. | |
| 9,397,726 | B2 | 7/2016 | Dobyns | |
| 9,485,039 | B1* | 11/2016 | Malkin | H04B 17/14 |
| 9,520,891 | B1 | 12/2016 | Kull et al. | |
| 9,584,144 | B1 | 2/2017 | Zhou et al. | |
| 10,116,318 | B1* | 10/2018 | Sharif | H03M 1/125 |
| 10,128,867 | B1* | 11/2018 | van Elzakker | H03M 1/124 |
| 10,348,322 | B1* | 7/2019 | Jeong | H03M 1/46 |
| 10,594,308 | B1 | 3/2020 | Sun et al. | |
| 10,637,493 | B1* | 4/2020 | Geddada | H03M 1/468 |
| 10,693,486 | B1* | 6/2020 | Ko | H03K 5/2481 |
| 10,812,098 | B1* | 10/2020 | Vishweshwara | H03M 1/466 |
| 10,862,496 | B1 | 12/2020 | Neto | |
| 10,886,937 | B1* | 1/2021 | Bandyopadhyay | H03M 3/464 |
| 10,903,846 | B1* | 1/2021 | Liu | H03M 1/68 |
| 11,043,958 | B2* | 6/2021 | Lin | H03M 1/38 |
| 11,387,838 | B1 | 7/2022 | Dyer et al. | |
| 11,476,868 | B2* | 10/2022 | Tangirala | H03M 1/468 |
| 11,863,198 | B2* | 1/2024 | Singh | H03M 1/804 |
| 2010/0013690 | A1 | 1/2010 | Kuramochi et al. | |
| 2011/0018605 | A1 | 1/2011 | Cho et al. | |
| 2013/0051501 | A1 | 2/2013 | Furuta | |
| 2013/0285844 | A1 | 10/2013 | Lin et al. | |
| 2014/0022105 | A1 | 1/2014 | Chen et al. | |
| 2014/0210653 | A1 | 7/2014 | Harpe | |
| 2015/0091746 | A1* | 4/2015 | Wang | H03M 1/1245 |
| | | | | 341/161 |
| 2016/0094239 | A1 | 3/2016 | Fujiwara et al. | |
| 2017/0201268 | A1 | 7/2017 | Sharma et al. | |
| 2017/0359081 | A1* | 12/2017 | Chen | H03M 1/34 |
| 2019/0074845 | A1* | 3/2019 | Nakamura | H03M 1/462 |
| 2019/0131997 | A1* | 5/2019 | Liu | H03M 1/46 |
| 2019/0166325 | A1* | 5/2019 | Kim | H04N 25/771 |
| 2023/0026315 | A1* | 1/2023 | Shrivastava | H01Q 3/22 |

OTHER PUBLICATIONS

T. Ali et al., "6.4 A 180mW 56Gb/s DSP-Based Transceiver for High Density IOs in Data Center Switches in 7nm FinFET Technology," 2019 IEEE International Solid-State Circuits Conference—(ISSCC), San Francisco, CA, USA, 2019, pp. 118-120, doi: 10.1109/ISSCC.2019.8662523.

Non-Final Office Action on U.S. Appl. No. 17/699,678 dtd May 9, 2023.

Non-Final Office Action on U.S. Appl. No. 17/700,166 dtd Jun. 15, 2023.

Notice of Allowance on U.S. Appl. No. 17/699,678 dtd Aug. 28, 2023.

Tomohiko Ogawa, et al, "Non-binary SAR ADC with Digital Error Correction for Low Power Applications," 2010 IEEE Asia Pacific Conference on Circuits and Systems, pp. 196-199, Dec. 2010.

Vito Giannini, "An 820uW 9b 40MS/s Noise-Tolerant Dynamic-SAR ADC in 90nm Digital CMOS," IEEE Solid-State Circuits Conference, pp. 237-238, 2008.

Partial European Search Report on Appln. No. EP25192420.5 dated Jan. 19, 2026.

* cited by examiner

1000 —

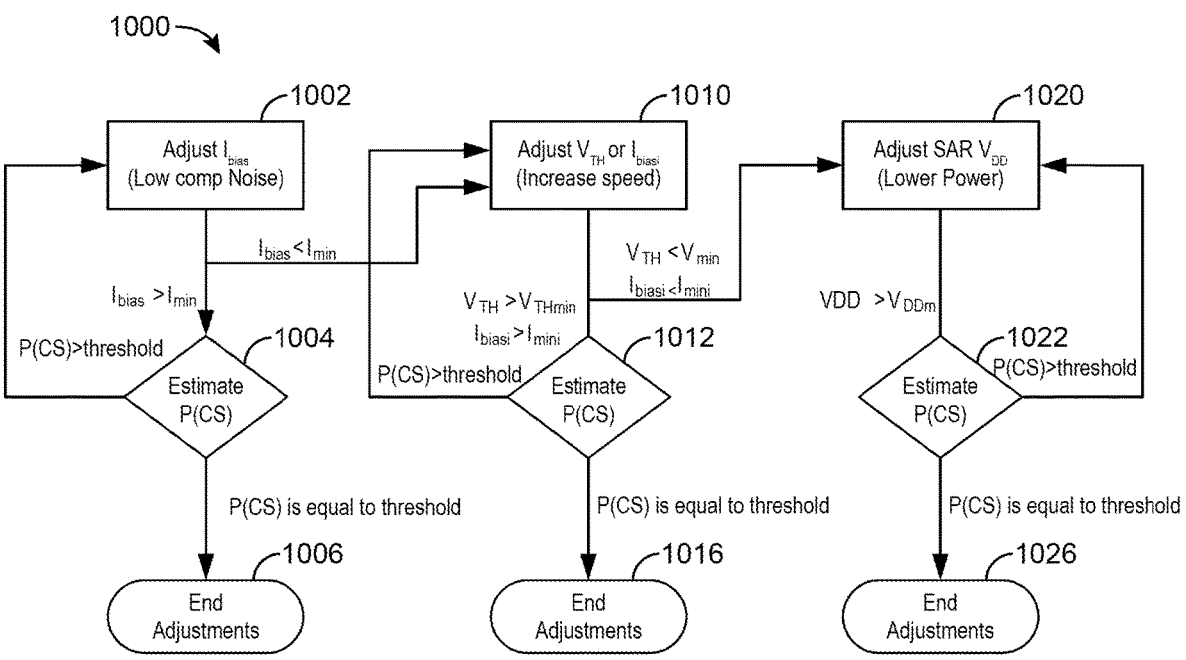

| 1002 | 1010 | 1020 |

Adjust $I_{bias}$ (Low comp Noise)     Adjust $V_{TH}$ or $I_{biasi}$ (Increase speed)     Adjust SAR $V_{DD}$ (Lower Power)

$I_{bias} < I_{min}$     $V_{TH} < V_{min}$ $I_{bias} > I_{min}$     $V_{TH} > V_{THmin}$     $I_{biasi} < I_{mini}$     $VDD > V_{DDm}$ P(CS)>threshold     $V_{TH} > V_{THmin}$     $I_{biasi} > I_{mini}$     P(CS)>threshold Estimate P(CS) 1004     P(CS)>threshold     Estimate P(CS) 1012     Estimate P(CS) 1022

P(CS) is equal to threshold     P(CS) is equal to threshold     P(CS) is equal to threshold End Adjustments 1006     End Adjustments 1016     End Adjustments 1026

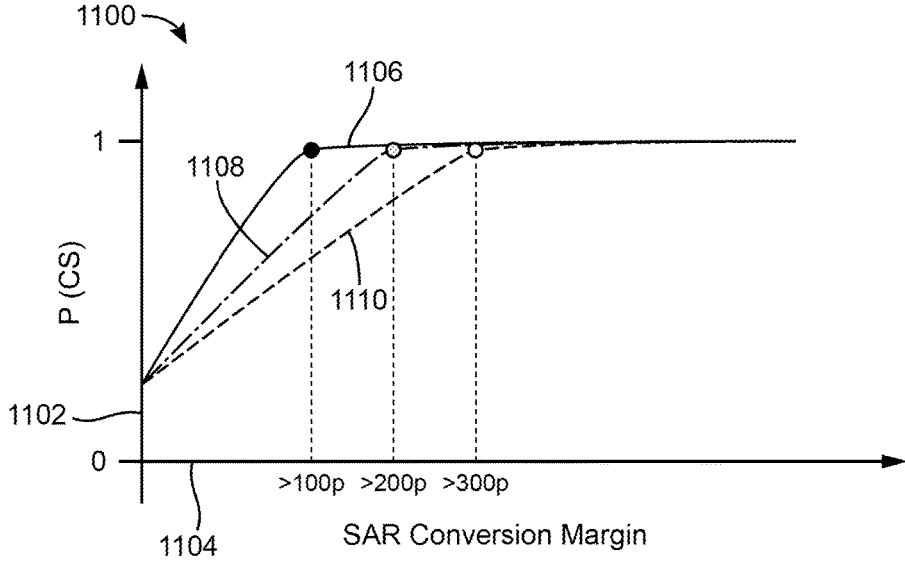

1106

1108

1110

P (CS)

1102 —

>100p  >200p  >300p

1104

SAR Conversion Margin

FIG. 10

SUCCESSIVE APPROXIMATION REGISTER ANALOG TO DIGITAL CONVERTER WITH REDUCED DATA PATH LATENCY

CROSS REFERENCE TO RELATED PATENT APPLICATIONS

This application is continuation of U.S. patent application Ser. No. 17/699,678, filed Mar. 21, 2022, the entire disclosure of which is incorporated by reference herein.

FIELD OF THE DISCLOSURE

This disclosure generally relates to a communication system, including but not limited to a communication system including a successive approximation register analog to digital converter (SAR ADC).

BACKGROUND OF THE DISCLOSURE

Recent developments in communication and computing devices demand high data rates. For example, network switches, routers, hubs or any communication devices may exchange data at a high speed (e.g., 1 Mbps to 100 Gbps) to stream data in real time or process a large amount of data in a seamless manner. To process data efficiently in the digital domain, an amplitude or a voltage of a signal may be represented by multiple bits, and the signal may be exchanged between two or more communication devices through a cable or a wireless medium. For example, 1.2 V of a signal may be represented as a byte (B) such as 00010110, and 1.3 V of the signal may be represented as a B such as 00011001. To convert a voltage of an input signal into corresponding bits, some communication devices implement a SAR ADC. For example, the SAR ADC may determine a plurality of bits corresponding to the input signal through successive approximation. Process, voltage and temperature (PVT) variations can affect the speed, precision and/or accuracy of SAR ADCs.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 9 is a flow diagram showing adaptation operations for performance and power efficiency optimization of the SAR ADC illustrated in FIG. 3A, according to one or more embodiments.

FIG. 10 is a graph showing probability versus conversion margin for the SAR ADC of FIG. 3A, according to one or more embodiments.

Figure 1A:
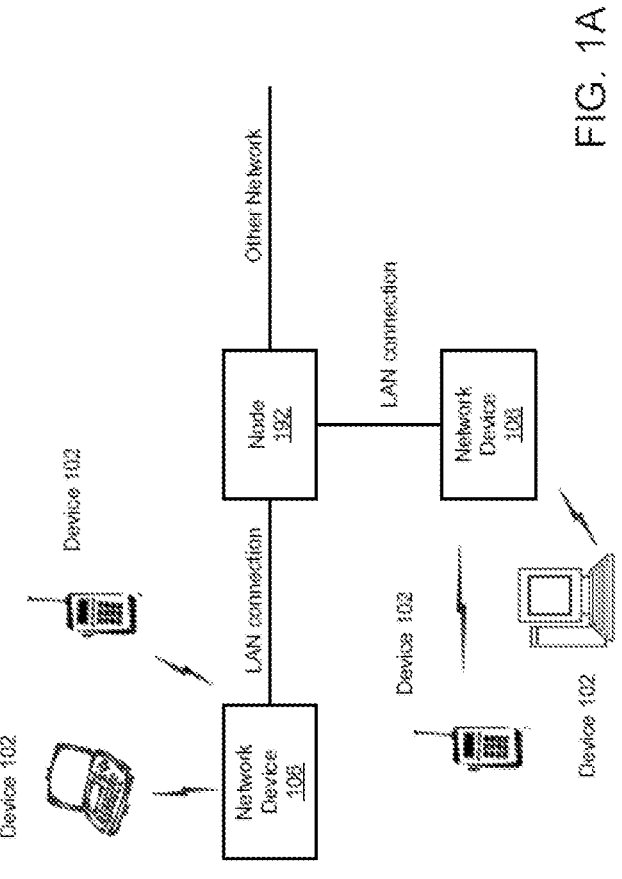
FIG. 1A is a general block diagram depicting a network environment including one or more access points in communication with one or more devices or stations, according to one or more embodiments.

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems and methods for power efficient SAR ADC, according to one or more embodiments.

Various embodiments disclosed herein are related to a device for communication of data. In some embodiments, the device includes or is a SAR ADC employed in a physical layer product. In some embodiments, the SAR ADC is a high speed (e.g., with resolutions beyond 7 and speeds of several hundred Mega samples per second operating frequency). In some embodiments, the SAR ADC is adaptively tuned for PVT operations to increase speed or reduce noise as appropriate. The adaptive feedback technique can adjust the comparator driver threshold to increase the speed of operation in the slow corner without any common mode voltage $V_{CM}$ related error in the fast (FF) corner in some embodiments. Advantageously, systems and methods described herein can provide a SAR ADC that has reduced latency, reduced area, reduced mismatches, and increased bandwidth for large SAR ADC arrays.

In some embodiments, an optimized (e.g., for power consumption and performance) SAR ADC having adaptive current or voltage parameter adjustments is provided. The SAR DAC is configured to adjust current or voltage parameters associated with the comparator to adjust speed of the comparator operation. Systems and methods adjust the comparator bias current or threshold voltages to enable a very high speed comparator with low noise and reduced power consumption (by 10 percent or more) in some embodiments. In some embodiments, current or voltage parameters are adjusted or adaptively tuned in accordance with a conversion margin. In some embodiments, the conversion margin is indicative of an amount of unused time during the compare operation available within a sampling cycle. In some embodiments, the conversion margin is determined using a time delay and probability relationship. In some embodiments, the current or voltage parameters include a current bias for a comparator current source, a threshold voltage for a comparator driver, a current bias for a comparator driver, and/or a supply voltage (e.g., $V_{DD}$ for the comparator or other voltage provided by an on-board supply regulator). In some embodiments, the SAR ADC employs an operational flow to sense conditions to determine the probability relationship and adjust the voltage and current parameters.

In some embodiments, the SAR ADC includes a data path configured for increased speed. The data path uses an enable signal (enable zero) to reset directly a capacitor digital to analog converter (CAPDAC) circuit which enables faster reset and improved CAPDAC circuit settling time. In some embodiments, the CAPDAC circuit receives feedback signals directly from ratioed latches instead of separate drivers, thereby increasing speed (e.g., by reducing the clock path delay significantly) and reducing layout complications. In some embodiments, the most significant bit (MSB) ratioed latch is driven by a single comparator driver while the remaining latches are driven by a second driver coupled to the single comparator driver. In some embodiments, the second driver is directly coupled to the single driver. In some embodiments, the use of this configuration of drivers reduces the load on the single comparator driver, thereby reducing settling time for the MSB and reducing layout complications.

Various embodiments disclosed herein are related to a device. The device includes digital to analog conversion (DAC) circuit configured to sample an input voltage, a comparator circuit coupled to the DAC circuit and having an output, a first set of storage circuits, and a comparator driver. The comparator driver is disposed between the comparator circuit and the first set of storage circuits. The first set of storage circuits are coupled to the comparator circuit and the DAC circuit. The first set of storage circuits is configured to store first bits corresponding to the input voltage. The comparator driver includes a first driver and second driver. The first driver is coupled to a first input of a first storage circuit of the first set of storage circuits, and the second driver is coupled to first inputs of a second set of storage circuits within the first set of storage circuits.

In some embodiments, the second set of storage circuits does not include the first storage circuit. In some embodiments, the first storage circuit stores a most significant bit of the first bits provided by the comparator circuit. In some embodiments, the second set of storage circuits includes all remaining storage circuits in the first set of storage circuits.

In some embodiments, the device also includes a third set of storage circuits coupled to the comparator circuit and the DAC circuit. The third set of storage circuits is configured to store second bits corresponding to the input voltage. In some embodiments, the comparator driver includes a third driver and a fourth driver. The third driver is coupled to a first input of a second storage circuit of the third set of storage circuits. The fourth driver is coupled to first inputs of a fourth set of storage circuits within the third set of storage circuits.

In some embodiments, the third driver is coupled to an input of the fourth driver. In some embodiments, the first driver is coupled to an input of the second driver. In some embodiments, the digital to analog conversion (DAC) circuit is reset by an enable signal received by the first set of storage circuits.

Various embodiments disclosed herein are related to a device. The device includes a digital to analog conversion (DAC) circuit configured to sample an input voltage. The DAC circuit includes reset transistors. The device also includes a comparator circuit coupled to the DAC circuit, a first set of storage circuits coupled to the comparator circuit and the DAC circuit, and an enable circuit configured to provide enable signals to the first set of storage circuits. The first set of storage circuits is configured to store first bits corresponding to the input voltage provided by the comparator circuit. One of the enable signals is provided to the reset transistors to reset the sample and digital to analog conversion (DAC) circuit.

In some embodiments, the one of the enable signals is an enable zero (EN0) signal. In some embodiments, the enable zero signal is a clock signal indicative the least significant bit being converted. In some embodiments, a delay is provided in a reset path associated with the reset transistors to ensure that a last conversion is not affected. In some embodiments, a comparator clock signal for the comparator circuit is stopped using the enable zero signal. In some embodiments, the enable circuit includes a number of flip flops, the flip flops being clocked by a comparator clock signal. In some embodiments, the device further includes a conversion status circuit which uses the one of the enable signals (e.g., an enable zero EN0 signal) to determine a conversion margin.

Various embodiments disclosed herein are related to a device. The device includes a digital to analog conversion (DAC) circuit configured to sample an input voltage, a comparator circuit coupled to the DAC circuit, and a first set of storage circuits coupled to the comparator circuit and the sample and DAC circuit. The first set of storage circuits is configured to store first bits corresponding to the input voltage. The first set of storage circuits are ratioed latches having outputs coupled to feedback inputs of the digital to analog conversion (DAC) circuit.

In some embodiments, the latches are set and reset latches. In some embodiments, the device further includes a comparator driver between an output of the comparator circuit and the first set of storage circuits. The comparator driver includes a first driver and second driver. The first driver is coupled to a first input of a first storage circuit of the first set of storage circuits, and the second driver is coupled to first inputs of a second set of storage circuits within the first set of storage circuits.

In some embodiments, the first storage circuit stores a most significant bit of the first bits provided by the comparator circuit, and the second set of storage circuits includes all remaining storage circuits in the first set of storage circuits. In some embodiments, the device further includes an enable circuit configured to provide enable signals to the first set of storage circuits. One of the enable signals (e.g., an enable zero EN0 signal) is provided to reset transistors in the sample and digital to analog conversion (DAC) circuit to reset the sample and digital to analog conversion (DAC) circuit.

In some embodiments, the conversion margin is indicative of unused or additional time during a compare operation available within a sampling cycle. In some embodiments, the control circuit is configured to determine the conversion margin and adjust the bias current, the threshold voltage, and/or the supply voltage on a periodic basis. In some embodiments, the control circuit is configured to determine the conversion margin and adjust the bias current, the threshold voltage, and/or the supply voltage at device power-up. In some embodiments, the control circuit is configured to adjust the bias current and the threshold voltage. In some embodiments, the control circuit is configured to adjust the bias current in response to the conversion margin, and the bias current is for a current mirror or a driver in the comparator circuit. In some embodiments, the control circuit is configured to adjust the threshold voltage in response to the conversion margin, and the threshold voltage is used by a driver in the comparator circuit. In some embodiments, the control circuit is configured to adjust the supply voltage in response to the conversion margin. In some embodiments, the device further includes a conversion status circuit configured to provide a conversion status signal, and the conversion status circuit includes a variable delay circuit. The control circuit adjusts the variable delay circuit to determine the conversion margin in some embodiments.

Various embodiments disclosed herein are related to an apparatus including a receiver. The apparatus can be used in communication applications. The receiver includes an analog-to-digital conversion (ADC) circuit including a comparator and a processor. The processor is configured to determine a conversion margin and adjust a current or voltage used in the comparator using the conversion margin. A sample clock signal is used to sample a voltage received by the ADC circuit in some embodiments.

A. Computing and Network Environment

Prior to discussing specific embodiments of the present solution, it can be helpful to describe aspects of the operating environment as well as associated system components (e.g., hardware elements) in connection with the methods and systems described herein. Referring to FIG. 1A, an embodiment of a network environment is depicted. In brief overview, the network environment includes a wireless communication system that includes one or more access points (APs) or network devices 106, one or more wireless communication devices 102 and a node 192. The wireless communication devices 102 can for example include laptop computers, tablets, personal computers and/or cellular telephone devices. The details of an embodiment of each wireless communication device 102 and/or network devices 106 or AP are described in greater detail with reference to FIGS. 1B and 1C. The network environment can be an ad hoc network environment, an infrastructure wireless network environment, a subnet environment, etc. in one embodiment. The network devices 106 or APs can be operably coupled to the network hardware or node 192 via local area network connections. The node 192, which can include a router, gateway, switch, bridge, modem, system controller, appliance, etc., can provide a local area network connection for the communication system. Each of the network devices 106 or APs can have an associated antenna or an antenna array to communicate with the wireless communication devices in its area. The wireless communication devices 102 can register with a particular network devices 106 or AP to receive services from the communication system (e.g., via a SU-MIMO or MU-MIMO configuration). For direct connections (e.g., point-to-point communications), some wireless communication devices can communicate directly via an allocated channel and communications protocol. Some of the wireless communication devices 102 can be mobile or relatively static with respect to network devices 106 or AP.

In some embodiments a network device 106 or AP includes a device or module (including a combination of hardware and software) that allows wireless communication devices 102 to connect to a wired network using wireless-fidelity (WiFi), or other standards. A network devices 106 or AP can sometimes be referred to as a wireless access point (WAP). A network devices 106 or AP can be implemented (e.g., configured, designed and/or built) for operating in a wireless local area network (WLAN). A network devices 106 or AP can connect to a router (e.g., via a wired network) as a standalone device in some embodiments. In other embodiments, a network devices 106 or AP can be a component of a router. A network devices 106 or AP can provide multiple devices access to a network. Network devices 106 or AP can, for example, connect to a wired Ethernet connection and provide wireless connections using radio frequency links for other devices 102 to utilize that wired connection. A network devices 106 or AP can be implemented to support a standard for sending and receiving data using one or more radio frequencies. Those standards, and the frequencies they use can be defined by the IEEE (e.g., IEEE 802.11 standards). Network devices 106 or AP can be configured and/or used to support public Internet hotspots, and/or on a network to extend the network's Wi-Fi signal range.

In some embodiments, the access points 106 can be used for (e.g., in-home or in-building) wireless networks (e.g., IEEE 802.11, Bluetooth, ZigBee, any other type of radio frequency based network protocol and/or variations thereof). Each of the wireless communication devices 102 can include a built-in radio and/or is coupled to a radio. Such wireless communication devices 102 and/or access points 106 can operate in accordance with the various aspects of the disclosure as presented herein to enhance performance, reduce costs and/or size, and/or enhance broadband applications. Each wireless communication device 102 can have the capacity to function as a client node seeking access to resources (e.g., data, and connection to networked nodes such as servers) via one or more access points 106.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In some embodiments, different types of data can be transmitted via different protocols. In other embodiments, the same types of data can be transmitted via different protocols.

Figure 1B:
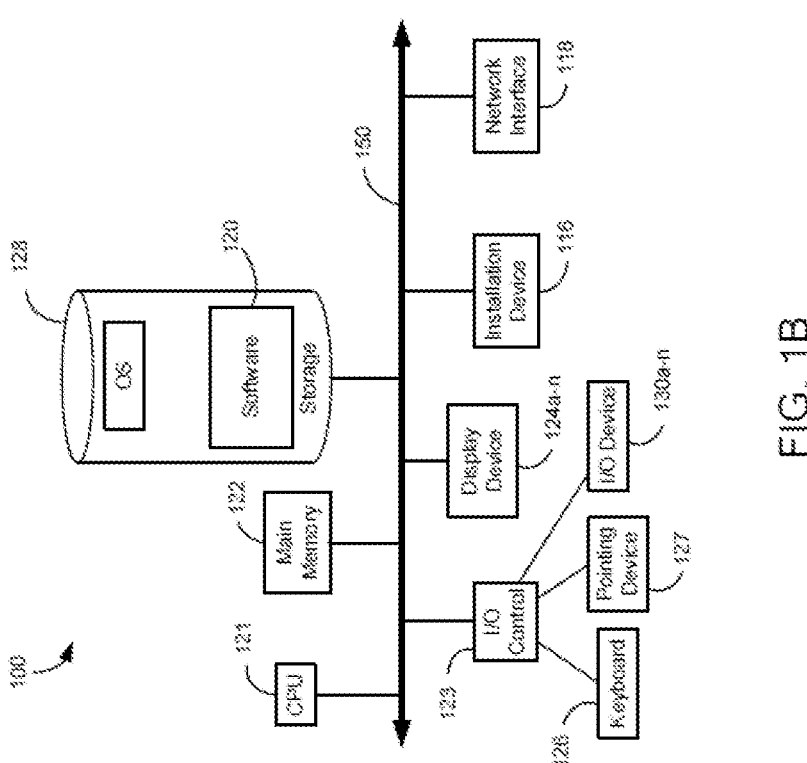
FIGS. 1B and 1C are general block diagrams depicting computing devices useful in connection with the methods and systems described herein, according to one or more embodiments.
Figure 1C:
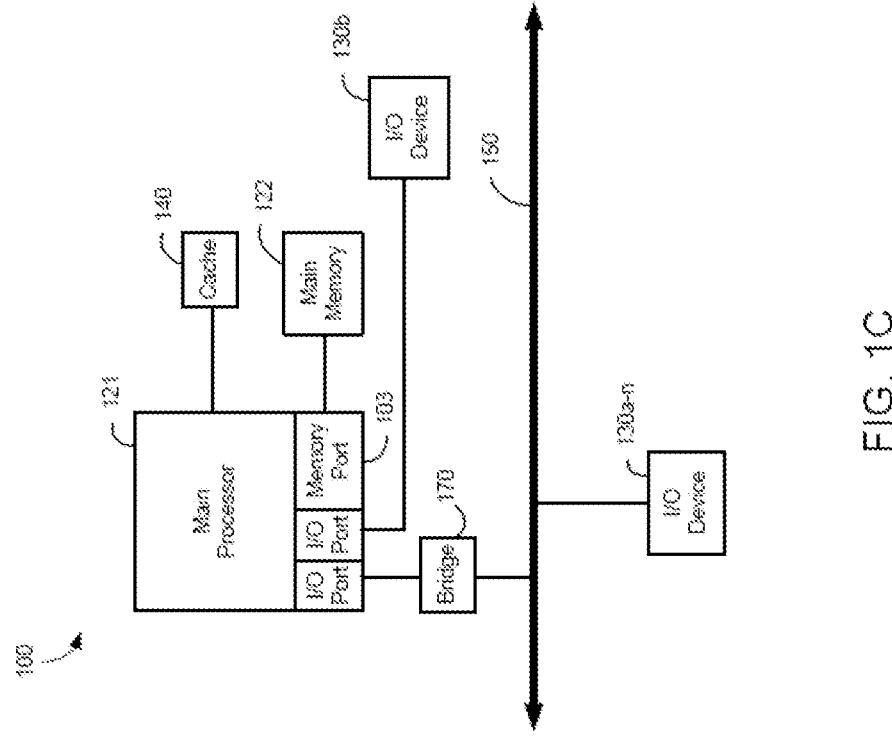

The communications device(s) 102 and access point(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or network devices 106 or AP. As shown in FIGS. 1B and 1C, each computing device 100 includes a processor 121 (e.g., central processing unit), and a main memory unit 122. As shown in FIG. 1B, a computing device 100 can include a storage device 128, an installation device 116, a network interface 118, an I/O controller 123, display devices 124a-124n, a keyboard 126 and a pointing device 127, such as a mouse. The storage device 128 can include an operating system and/or software. As shown in FIG. 1C, each computing device 100 can also include additional optional elements, such as a memory port 103, a bridge 170, one or more input/output devices 130a-130n, and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Santa Clara, California; those manufactured by International Business Machines of White Plains, New York; or those manufactured by Advanced Micro Devices of Sunnyvale, California. The computing device 100 can be based on any of these processors, or any other processor capable of operating as described herein.

Main memory unit 122 can be one or more memory chips capable of storing data and allowing any storage location to be directly accessed by the microprocessor 121, such as any type or variant of Static random access memory (SRAM), Dynamic random access memory (DRAM), Ferroelectric RAM (FRAM), NAND Flash, NOR Flash and Solid State Drives (SSD). The main memory 122 can be based on any of the above described memory chips, or any other available memory chips capable of operating as described herein. In the embodiment shown in FIG. 1B, the processor 121 communicates with main memory 122 via a system bus 150 (described in more detail below). FIG. 1C depicts an embodiment of a computing device 100 in which the processor communicates directly with main memory 122 via a memory port 103. For example, in FIG. 1C the main memory 122 can be DRDRAM.

FIG. 1C depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is provided by, for example, SRAM, BSRAM, or EDRAM. In the embodiment shown in FIG. 1C, the processor 121 communicates with various I/O devices 130 via a local system bus 150. Various buses can be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 121 can use an Advanced Graphics Port (AGP) to communicate with the display 124. FIG. 1C depicts an embodiment of a computer 100 in which the main processor 121 can communicate directly with I/O device 130b, for example via HYPERTRANSPORT, RAPIDIO, or INFINI-BAND communications technology. FIG. 1C also depicts an embodiment in which local busses and direct communication are mixed: the processor 121 communicates with I/O device 130a using a local interconnect bus while communicating with I/O device 130b directly.

A wide variety of I/O devices 130a-130n can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, California.

Referring again to FIG. 1B, the computing device 100 can support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., configured and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to a network through a variety of connections including, but not limited to, standard telephone lines, LAN or WAN links (e.g., 802.11, T1, T3, 56kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 can include or be connected to one or more display devices 124a-124n. As such, any of the I/O devices 130a-130n and/or the I/O controller 123 can include any type and/or form of suitable hardware, software, or combination of hardware and software to support, enable or provide for the connection and use of the display device(s) 124a-124n by the computing device 100. For example, the computing device 100 can include any type and/or form of video adapter, video card, driver, and/or library to interface, communicate, connect or otherwise use the display device(s) 124a-124n. In one embodiment, a video adapter can include multiple connectors to interface to the display device(s) 124a-124n. In other embodiments, the computing device 100 can include multiple video adapters, with each video adapter connected to the display device(s) 124a-124n. In some embodiments, any portion of the operating system of the computing device 100 can be configured for using multiple displays 124a-124n. In further embodiments, an I/O device 130 can be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a fiber optic bus, a Serial Attached small computer system interface bus, a USB connection, or a HDMI bus.

A computing device 100 of the sort depicted in FIGS. 1B and 1C can operate under the control of an operating system, which controls scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7, 8 and 10, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computer system 100 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. In some embodiments, the computing device 100 can have different processors, operating systems, and input devices consistent with the device. For example, in one embodiment, the computing device 100 is a smart phone, mobile device, tablet or personal digital assistant. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. SAR ADC

Various embodiments disclosed herein are related to a SAR ADC, such as, a high speed SAR ADC or very high speed SAR ADC. In some embodiments, the SAR ADC is relatively immune to PVT variations and is configured for use in 200G/100G networking applications. In some embodiments, the systems and methods described herein for a SAR ADC used in network integrated circuits (ICs) such as a 225 Gbps PAM4 Optical Transceiver or other transceiver. In some embodiments, the systems and methods described herein provide a speed advantage without a significant power/area penalty. The SAR ADC can be utilized in or communicate with the various components discussed above with reference to FIGS. 1A-C. The SAR ADC can operate according to the principles described herein and use the conversion structure and operations described in U.S. Pat. No. 10,903,846 assigned to the assignee of the present application and incorporated herein by reference in its entirety. The SAR ADC can operate according to the principles described herein and use the conversion structure and operations described in U.S. patent application Ser. No. 17/700,166 invented by Singh et al. and filed on Mar. 21, 2022 and U.S. patent application Ser. No. 17/694,225 invented by Liu et al. and filed on Mar. 14, 2022, both assigned to the assignee of the present application and incorporated herein by reference in their entireties.

Figure 2:
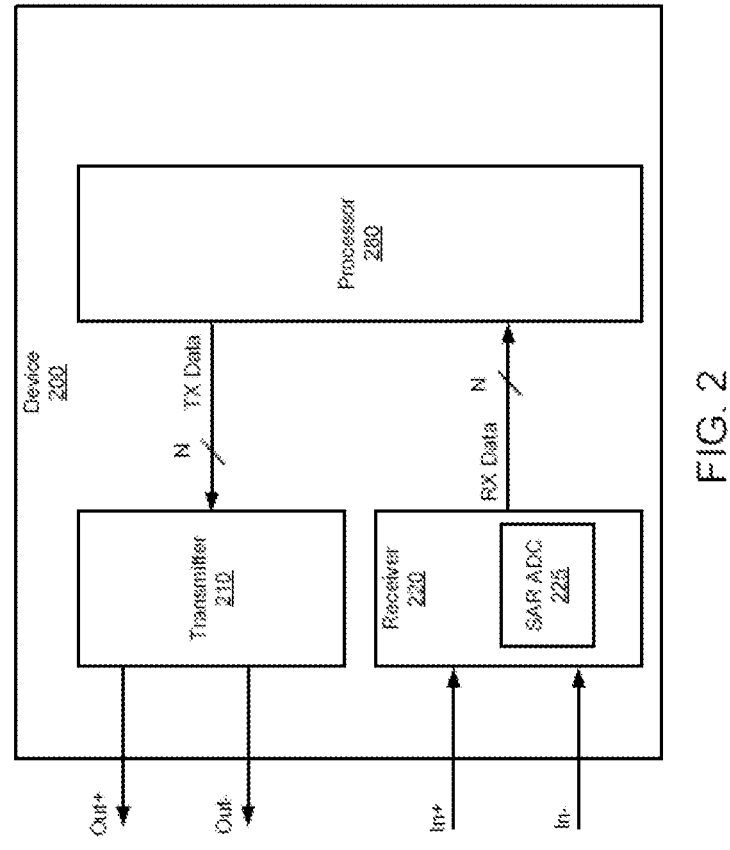
FIG. 2 is a general block diagram depicting a communication device, according to one or more embodiments.

FIG. 2 is a block diagram depicting a communication device 200, according to one or more embodiments. In some embodiments, the communication device 200 is a system, a device, or an apparatus for network communications. For example, the communication device 200 is implemented as part of the network device 106, the node 192 or network component, the device 102, or network equipment serving a network in communication with device 102. In some embodiments, the device 200 includes a transmitter 210, a receiver 220, and a processor 280. These components may operate together to communicate with another communication device through a network cable (e.g., Ethernet, USB, Firewire, etc.) and/or through a wireless medium (e.g., Wi-Fi, Bluetooth, 60 GHz link, cellular network, etc.). In some embodiments, the communication device 200 includes more, fewer, or different components than shown in FIG. 2.

The transmitter 210 is a circuit or a component that receives transmit data TX Data from the processor 280, and generates output signals Out+, Out−. The transmitter 210 may receive N bits of digital data TX Data from the processor 280, and generate the output signals Out+, Out− having voltages or currents corresponding to the digital data TX Data. The output signals Out+, Out− may be differential signals. In some embodiments, the transmitter 210 may generate a single ended signal or a signal in a different representation for the output signals Out+, Out−. In some embodiments, the transmitter 210 transmits the output signals Out+, Out− through a network cable. In some embodiments, the transmitter 210 provides the output signals Out+, Out− to a wireless transmitter (not shown) that can upconvert the output signals Out+, Out− to generate a wireless transmit signal at a radio frequency and transmit the wireless transmit signal through a wireless medium.

The receiver 220 is a circuit or a component that receives input signals In+, In−, and generates receive data RX Data. In some embodiments, the receiver 220 receives the input signals In+, In− through a network cable. The input signals In+, In− may be differential signals. In some embodiments, the receiver 220 may receive a single ended signal or a signal in a different representation for the input signals In+, In−. In some embodiments, the receiver 220 receives the input signals In+, In− from a wireless receiver (not shown) that can receive a wireless receive signal through a wireless medium and downconvert the wireless receive signal to generate the input signals In+, In− at a baseband frequency. In some embodiments, the receiver 220 receives the input signals In+, In− and generates N bits of digital data RX Data corresponding to voltages or currents of the input signals In+, In−. The receiver 220 may provide the digital data RX Data to the processor 280. In some embodiments, the receiver 220 includes a SAR ADC 225 that can convert the input signals In+, In− into N-bit digital data RX Data.

The processor 280 is a circuit or a component that can perform logic computations. In some embodiments, the processor 280 is implemented as a field-programmable gate array, an application-specific integrated circuit, or state machine. The processor 280 may be electrically coupled to the transmitter 210 and the receiver 220 through conductive traces or bus connections. In this configuration, the processor 280 may receive the data RX Data from the receiver 220 and perform logic computations or execute various applications according to states of the received data RX Data. The processor 280 may also generate the data TX Data, and provide the data TX Data to the transmitter 210.

Figure 3A:
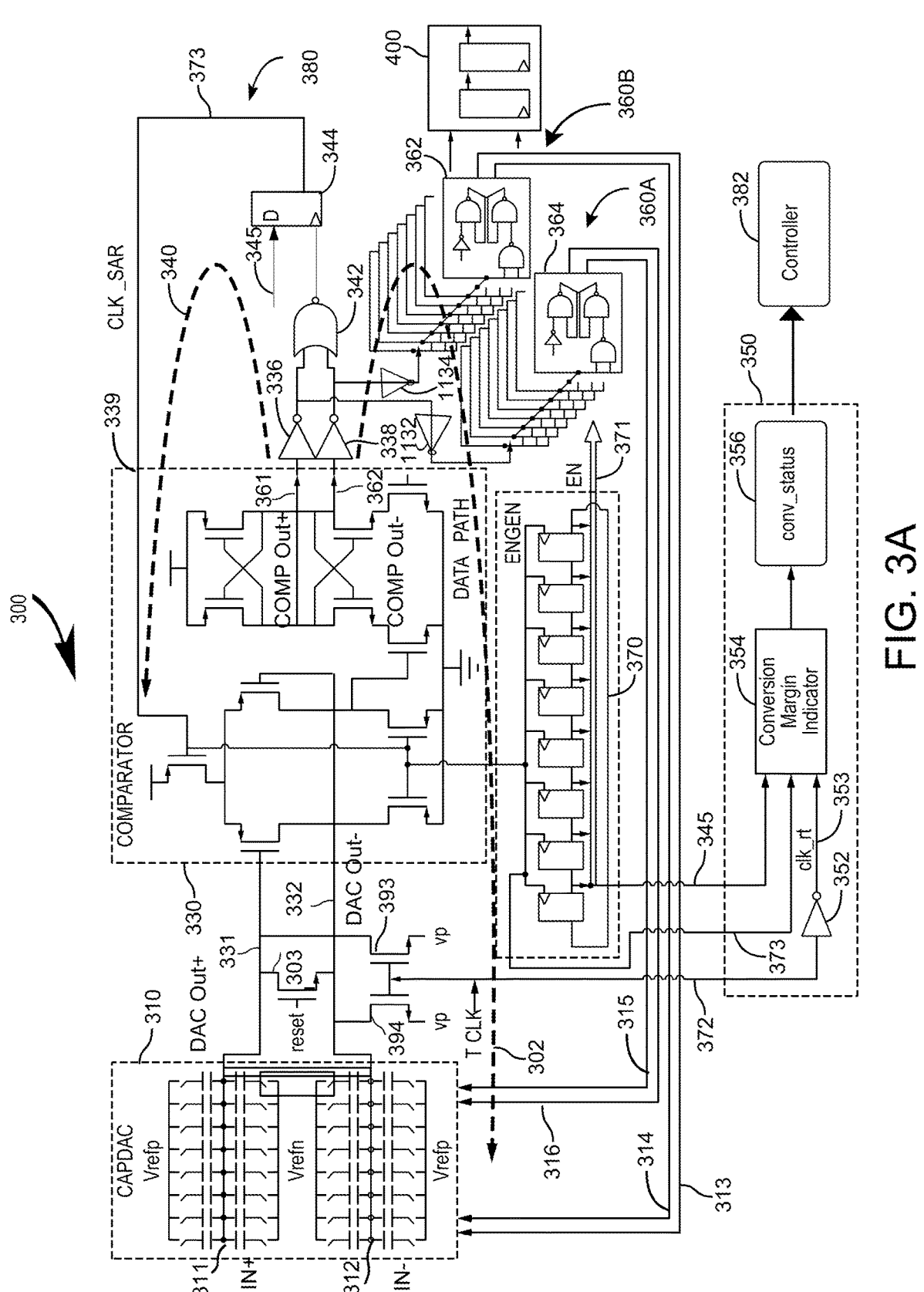
FIG. 3A is a schematic diagram of a SAR ADC capable of being used in the communication device illustrated in FIG. 2, according to one or more embodiments.

With reference to FIG. 3A, a SAR ADC 300 may be implemented as SAR ADC 225 illustrated in FIG. 2. In some embodiments, the SAR ADC 300 includes a sample capacitor and digital to analog (CAPDAC) circuit 310, a comparator circuit 330, a conversion status circuit 350, a first set of storage circuits 360A, a second set of storage circuits 360B, an enable circuit 370, a clock path circuit 380, a controller 382, and a re-timer circuit 400. These components may operate together to receive input signals In+, In− and perform successive approximation analog to digital conversion to generate L-bit data RX Data corresponding to voltages of the input signals In+, In−, where L is any integer. In some embodiments, the SAR ADC 300 includes more, fewer or different components than shown in FIG. 3. Although in FIG. 3A, the CAPDAC circuit 310, the comparator circuit 330, and the storage circuits 360A, 360B are shown as generating and processing differential signals, some or all of these components may generate and process single ended signals. Additional comparator circuits and storage circuits can be provided in a cascaded, pipelined or serial fashion (e.g., a two comparator design for SAR ADC 300). SAR ADC 300 is an IC device integrated on a single substrate, provided in a multi-chip package, or is part of another IC device in some embodiments.

In some embodiments, the sample and DAC circuit 310 is a circuit or a component that samples the input signals In+, In−, and generates DAC output signals DAC Out+, DAC Out−. In one implementation, the sample and DAC circuit 310 is embodied as a capacitive DAC circuit. In some embodiments, the sample and DAC circuit 310 includes inputs 311 and 312 configured to receive the input signals In+, In−, feedback ports 313, 314, 315, and 316 configured to receive L-bit data RX Data, and output ports 331 and 332 configured to output DAC output signals DAC Out+, DAC Out−. In some embodiments, N number of feedback ports 315 and 316 are coupled to N number of output ports of the first set of storage circuits 360A, and M number of feedback ports 314 and 314 are coupled to M number of output ports of the second set of storage circuits 360B, where M and N are any integers. In some examples, N may be 4, 6, 8, 9, 10, 16, 32, and M may be 4, 6, 8, 9, 10, 16 or 31. N and M can be equal and can be equal to L in some embodiments. The first output port 331 of the sample and DAC circuit 310 is coupled to a first input port of the comparator circuit 330 in some embodiments. The second output port 333 of the sample and DAC circuit 310 is coupled to a second input port of the comparator circuit 330. In some embodiments, the sample and DAC circuit 310 receives the input signals In+, In− at the inputs 311 and 312 and L-bit data RX Data at the feedback ports 313, 314, 315, and 316, and samples the input signals In+, In−. The sample and DAC circuit 310 may perform DAC, according to the L-bit data RX Data to generate DAC output signals DAC Out+, DAC Out− at the output ports 331 and 332. The sample and DAC circuit 310 may provide the DAC output signals DAC Out+, DAC Out− to the comparator circuit 330. In one approach, for a bit $X^{th}$ of the L-bit data RX Data, the DAC output signals DAC Out+, DAC Out− indicate voltages (e.g., Vin+, Vin−) of the input signals In+, In− with voltages corresponding to L-X number of MSB(s) of Data RX. In one approach, the sample and DAC circuit 310 generates the DAC output signals DAC Out+, DAC Out−, according to the following equation:

$$V_{DACOut+} - V_{DACOut-} =$$
$$-(V_{in+} - V_{in-}) + \sum_{k=X}^{L} 2^{k-L-1} \times Vref \times (2 * RXData(k) - 1);$$

where $V_{DAC\ Out}+$ is the voltage of the DAC Out+ signal, $V_{DAC\ Out}-$ is the voltage of the DAC Out− signal, and $V_{ref}$ is the reference voltage.

In some embodiments, the comparator circuit 330 is a circuit or a component that receives the DAC output signals DAC Out+, DAC Out−, and determines a state of a corresponding bit of the data RX Data according to the DAC output signals DAC Out+, DAC Out−. In some embodiments, the comparator circuit 330 includes a first output port 361 coupled to first input ports of the first set of storage circuits 360A via inverter 336 and inverter 1132, a second output port 362 coupled to input ports of the second set of storage circuits 360B via inverter 338 and inverter 1134, and a clock input 339 coupled to a conductor 373.

Conductor 373 is coupled to an output of flip flop 344 (e.g., D-flip flop) of clock path circuit 380. A clock path 340 includes conductor 373, inverters 336, 338, and clock path circuit 380 which includes a logic device 342, and flip flop 344. A data path 302 includes first set of storage circuits 360A and second set of storage circuits 360B and extends between feedback ports 313, 314, 315, and 316 of CAPDAC circuit 310 and output ports 361 and 362 of comparator circuit 330. The first output port 361 of the comparator circuit 330 may be directly coupled to the first input ports of the storage circuits 360A, and the second output port 362 of the comparator circuit 330 may be directly coupled to the input ports of the second storage circuits 360b in some embodiments.

Comparator circuit 330 may be enabled or disabled according to the clock signal CLK_SAR at clock input 339 from the clock path circuit 380 on conductor 373. The clock signal CLK_SAR is a comparator clock signal for the comparator circuit 330 which is disabled or stopped using the enable zero signal. For example, comparator circuit 330 is enabled in response to a rising edge or logic state '1' of the clock signal CLK_SAR and is disabled in response to a falling edge or logic state '0' of the clock signal CLK_SAR. When the comparator circuit 330 is enabled, the comparator circuit 330 may determine a state of a bit according to the DAC output signals DAC Out+, DAC Out−, and generate comparator outputs Comp Out1+, Comp Out1− at the output ports 361 and 362 indicating the determined state of the bit. For example, when the comparator circuit 330 is enabled, in response to a difference in voltages of the DAC output signal DAC Out+, DAC Out− being higher than 0V or a reference voltage the comparator circuit 330 may generate the comparator output Comp Out1+having a logic state '1' and the comparator output Comp Out1− having a logic state '0'. For example, when the comparator circuit 330 is enabled, in response to a difference in voltages of the DAC output signals DAC Out+, DAC Out− being lower than 0V or the reference voltage, the comparator circuit 330 may generate the comparator output Comp Out1+ having a logic state '0' and the comparator output Comp Out1− having a logic state '1'. When the comparator circuit 330 is disabled, the comparator circuit 330 may reset the comparator outputs Comp Out1+, Comp Out1− to logic state '0'. The comparator circuit 330 may provide the comparator outputs Comp Out1+, Comp Out1− to the first set of storage circuits 360A and the second set of storage circuits 360B. The comparator outputs Comp Out1+, Comp Out1− may be differential signals.

Figure 3B:
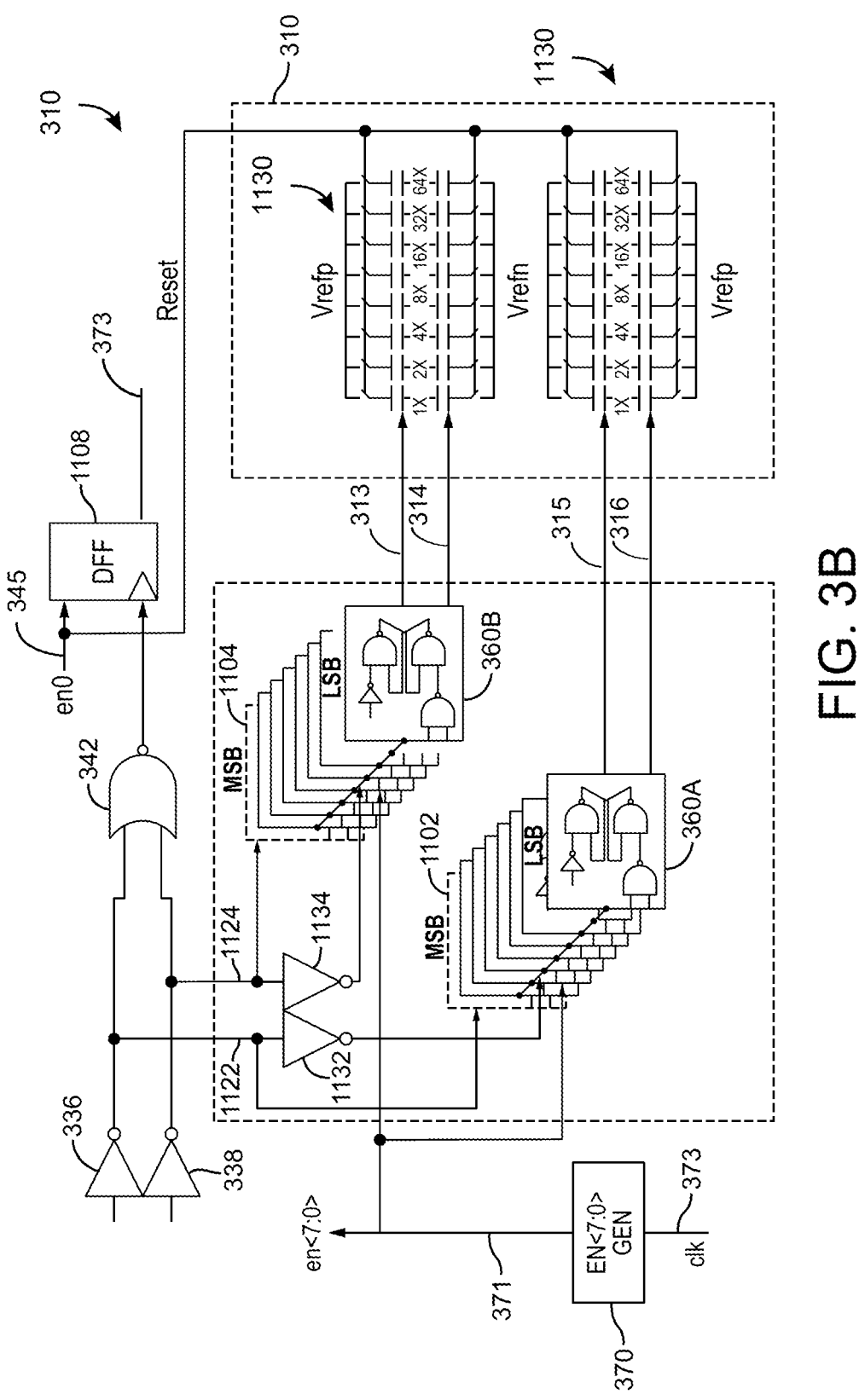
FIG. 3B is a more detailed drawing of a portion of the SAR ADC illustrated in FIG. 3, according to one or more embodiments.

With reference to FIG. 3B, in some embodiments, the first set of storage circuits 360A is a set of components that stores N bits (e.g., 2, 4, 6, 8, 9, 16, 32 bits, etc.) of data. In one implementation, the first set of storage circuits 360A is embodied as N number of flip flops or latches. In some embodiments, the set of storage circuits 360A are ratioed set reset (SR) latches. In some embodiments, the ratioed latches each include an output stage configured to drive feedback ports 313, 314, 315, and 316 according to its bit position. In some embodiments, a first input port of each storage circuit 360A other than storage circuit 1102 is coupled to the first output port 361 (FIG. 3A) of the comparator circuit 330 through inverters 336 and 1132 (FIG. 3B). In some embodiments, an enable port of each storage circuit 360A is coupled to a corresponding enable output port of the enable circuit 370, and an output port of each storage circuit 360A is coupled to a corresponding feedback port 315 and 316 of the sample and DAC circuit 310. In some embodiments, the first input port of storage circuit 1102 in set of storage circuits 360A (e.g., corresponding to a most significant bit (MSB)) is coupled to the first output port 361 of the comparator circuit through inverter 336. In this configuration, each storage circuit 360A may be enabled or disabled according to a corresponding bit of enable signal EN on enable bus 371. For example, a first storage circuit of storage circuits 360A is enabled, in response to the enable signal EN being 00001 (the enable zero signal EN0); a second storage circuit of storage circuits 360A is enabled in response to the enable signal EN being 00010; a third storage circuit of storage circuits 360A is enabled, in response to the enable signal EN being 00100; a fourth storage circuit of storage circuits 360A is enabled in response to the enable the enable signal EN being 01000; and a fifth storage circuit of storage circuits 360A is enabled in response to the enable signal EN being 10000. The enable scheme follows the scheme as set forth above for the remaining storage circuits 360A and 360B in some embodiments. For example, all of the first set of storage circuits 360A are disabled, in response to the enable signal EN being 00000. When a storage circuit 360A is enabled, the storage circuit 360A may update a corresponding bit of data RX Data, according to the comparator outputs Comp Out1+, Comp Out1−. For example, if a storage circuit 360A is enabled, in response to the comparator output Comp Out1+having a logic state '1' and the comparator output Comp Out1− having a logic state '0', the storage circuit 360A may update a corresponding bit of the data RX Data to '1'. For example, if a storage circuit 360A is enabled, in response to the comparator output Comp Out1− having a logic state '1' and the comparator output Comp Out1+ having a logic state '0', the storage circuit 360A may update a corresponding bit of the data RX Data to '0'. If a storage circuit of storage circuits 360A is disabled, the storage circuit may hold or maintain a corresponding bit of the data RX Data, irrespective of the comparator outputs Comp Out1+, Comp Out1− at the input ports.

In some embodiments, the second set of storage circuits 360B is a set of components that stores M bits of data. In one implementation, the second set of storage circuits 360B is embodied as M number of flip flops or latches. In some embodiments, the set of storage circuits 360B are ratioed set reset (SR) latches. In some embodiments, a first input port of each storage circuit 360B except for storage circuit 1104 is coupled to the first output port 362 (FIG. 3A) of the comparator circuit 330 through inverters 338 and 1134. In some embodiments, an enable port of each storage circuit 360B is coupled to a corresponding enable output port of the enable circuit 370 via bus 371. In some embodiments, the first input port of storage circuit 1104 (FIG. 3B) in set of storage circuits 360B (e.g., corresponding to a most significant bit (MSB)) is coupled to the first output port 362 of the comparator circuit 330 through inverter 338. An output port of each storage circuit 360B is coupled to a corresponding feedback port 313 and 314 of the sample and DAC circuit 310. In some embodiments, operation of the storage circuits 360B is similar to the operation of the first set of storage circuits 360A and the enabling of the storage circuits 360B using the enable signal EN on bus 371 occurs as discussed above. In some embodiments, storage circuits 360A are for the positive portion of the differential signal, and storage circuits 360B are for the negative portion of the differential signal.

By directly driving only the storage circuit 1102 with a driver (e.g., inverter 336) and directly driving only the storage circuit 1104 with a driver (e.g., inverter 338), the load of the comparator driver (e.g., inverters 336 and 338) is reduced. This drive scheme can also simplify circuit layout. The remaining storage circuits of storage circuits 360A-B are driven by different drivers (e.g., inverters 1132 and 1134, respectively) in some embodiments. Inverter 336 has an output directly coupled to an input of inverter 1132, and inverter 338 has an output directly coupled to an input of inverter 1134 in some embodiments. Inverters 336 and 338 directly drive the inputs of storage circuits 1102 and 1104 which represent the MSB in some embodiments.

The delay in the data path 302 (FIG. 3A) can be reduced by using an SR latch directly driving CAPDAC circuit 310 as opposed to using ratioed inverters between storage circuits 360A-B and CAPDAC circuit 310. With reference to FIG. 3B, the enable 0 (EN0) signal on conductor 345 resets CAPDAC circuit 310 by driving the gates of switches or transistors 1130 in CAPDAC circuit 310. The storage circuits 360A and 360B are enabled by the enable signal EN provided on bus 371 as described above.

Re-timer circuit 400 is a flip flop or latched based circuit that receives outputs from storage circuits 360A and 360B. Re-timer circuit 400 aligns timing for downstream devices or components in some embodiments.

In some embodiments, the conversion status circuit 350, enable circuit 370, and clock path circuit 380 cause the comparator circuit 330 and the storage circuits 360A, 360B to perform successive approximation analog to digital conversion. In some embodiments, the conversion status circuit 350, enable circuit 370, and clock path circuit 380 are implemented as a state machine and/or digital logic circuits. In some embodiments, a conductor 372 receives a T clock signal (T CLK), for example, from a clock generator (not shown). The T clock signal is a sampling clock and has a period corresponding to the sampling cycle.

With reference to FIG. 3A, the clock path circuit 380 provides the CLK_SAR signal on clock path 340 at conductor 373 for comparator circuit 330 and enable circuit 370 which provides enable signals on bus 371. Flip flop 344 is configured as a D-type flip flop and includes an input coupled to conductor 345 which receives the enable 0 (EN0) signal from enable circuit 370. Flip flop 344 includes a clock input coupled to logic device 342 which can be configured a NAND gate. Logic device 342 receives signals from inverters 336 and 338. Inverters 336, 338, 1132 and 1134 are configured as a comparator driver. The CLK_SAR signal is an internally generated clock signal provided by flip flop 344, logic device 342, inverters 336 and 338 and comparator circuit 330 in some embodiments. The CLK_SAR signal is generated from comparator transitions and the enable 0 (EN0) signal in some embodiments.

Enable circuit 370 is a latch or flip flop (e.g., D flip flop) based timing circuit that provides the enable EN signal on bus 371 for storage elements 360A and 360 B in response to the clock signal on conductor 373. Each flip flop or latch in enable circuit 370 is driven at a clock input by the CLK_SAR signal on conductor 373 and provides a bit of the enable EN signal on bus 371. The enable 0 (EN0) signal from enable circuit 370 is provided on conductor 345 for use by conversion status circuit 350 and flip flop 344 of clock path circuit 380. The enable 0 (EN0) signal, which is an indicator of the start of the last conversion cycle, is used to force an early reset (e.g., using transistors 1130 (FIG. 3B)) via conductor 345. The transistor 303 can be used to reset CAPDAC circuit 310 using the enable 0 (EN0) signal or other reset signal. A delay (e.g., a delay path or element) can be provided in the reset path associated with the enable 0 (EN0) signal to ensure that the last conversion is not affected by the reset operation using the enable 0 (EN0) signal. In some embodiments, the conductor 345 is directly coupled to transistors 1130.

Conversion status circuit 350 includes an inverter 352, a conversion margin indicator circuit 354 and a conversion status output 356. Inverter 352 receives the T clock signal at a conductor 372 and provides a CLK_RT signal to conversion margin indicator circuit 354. Conversion margin indicator circuit 354 receives the enable 0 (EN0) signal at conductor 345 and receives the CLK_SAR signal at conductor 372. Conversion status circuit 350 provides a conversion status signal at output 356 indicative of the status conversion operation. Conversion margin indicator circuit 354 provides signals for determining a conversion margin using the CLK_RT signal, enable 0 (EN0) signal, and the CLK_SAR signal at conductor 372.

In some embodiments, controller 382 is an on-chip controller configured to determine a conversion margin and adjust current and voltage parameters to achieve faster operation or less noise. Advantageously, controller 382 implements systems and methods described herein for determining conversion margin and adjusting voltage and current parameters in some embodiments. The controller 382 can be a hardware implementation or software (e.g., firmware implementation) integrated with SAR ADC 300 (e.g., provided as part of conversion status circuit 350 or other part or parts of SAR ADC 300). In some embodiments, the processor or controller 382 determines a probability of a successful conversion being greater than a first threshold, and the successful conversion is defined when the conversion margin is greater than a second threshold. In some embodiments, controller 382 is processor, microcontroller, an application specific integrated circuit (ASIC), a field programmable gate array (FPGA) or logic device, or any other type and form of dedicated semiconductor logic or processing circuitry capable of processing or supporting the operations described herein. In some embodiments, operations associated with controller 382 are performed wholly or in part by processor 280 (FIG. 2).

Figure 4:
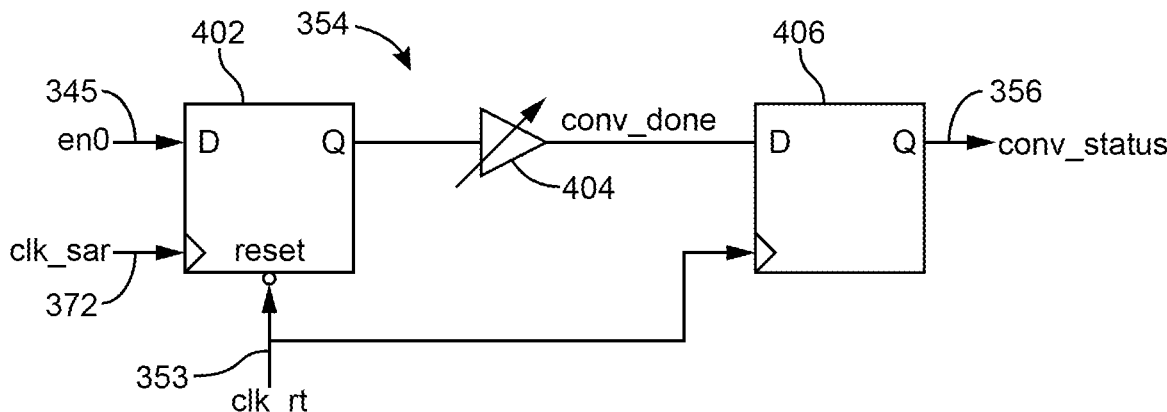
FIG. 4 is a schematic diagram of a conversion status circuit for the SAR ADC illustrated in FIG. 3A, according to one or more embodiments.

With reference to FIG. 4, conversion margin indicator circuit 354 includes a D flip flop 402, a variable time delay circuit 404 and a D flip flop 406. Variable time delay circuit 404 is a programmable or configurable circuit that provides a selectable delay in some embodiments. D flip flop 402 includes a reset input coupled to conductor 353 for receiving the CLK_RT signal from inverter 352 (FIG. 3), and D flip flop 406 includes a clock input coupled to conductor 353 for receiving the CLK_RT signal from inverter 352. A D input of flip flop 402 is coupled to conductor 345 to receive the enable 0 (EN0) signal. An output of D flip flop 402 is coupled to an input of delay circuit 404. The clock input of D flip flop 402 is coupled to conductor 372 to receive the CLK_SAR signal. The D input of flip flop 406 is coupled to receive a conversion done signal from variable time delay circuit 404.

The conversion done signal indicates when a conversion of the analog signal at inputs 311 and 312 to a digital representation in storage circuits 360A-B has been completed in some embodiments. The conversion status signal is indicative that the conversion has occurred before the end of the sampling cycle in some embodiments. The conversion margin can be represented by or be proportional to a difference of the leading edge of the conversion done signal and the conversation status signal in some embodiments. In some embodiments, the conversion status circuit 350 provides the conversion status signal at output 356. SAR ADC 300 (e.g., microcontroller 382) can apply an adaptive feedback technique using the conversion margin determined from the conversion status signal and the conversion done signal or other parameter related thereto. The adaptive feedback can advantageously compensate for noise from comparator circuit 330 and process dependency associated with the driver (e.g., inverter 336 and 338) for the comparator circuit 330. In some embodiments, the conversion margin indicator circuit 354 is configured so that the approximate value of conversion margin using the conversion status signal can be deduced.

Figure 5:
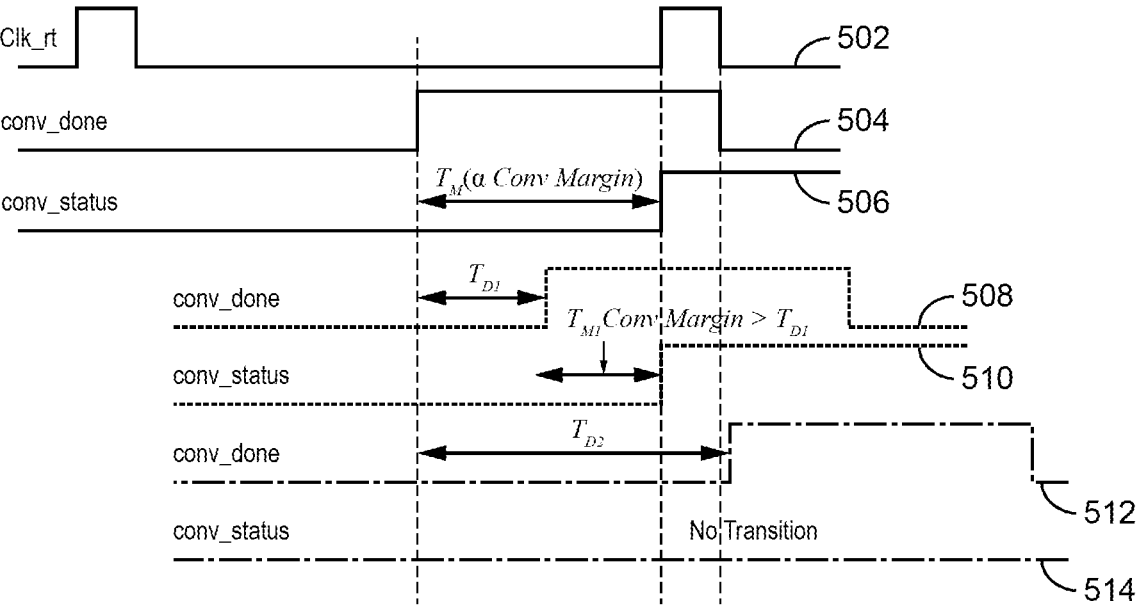
FIG. 5 is a timing diagram showing a conversion status signal provided by the conversion status circuit illustrated in FIG. 4, according to one or more embodiments.

With reference to FIG. 5, wave form 502 is the CLK_RT signal at conductor 353. Wave form 504 is the conversion done signal indicating that the conversion has been completed and is provided by time delay circuit 404 to the D input of flip flop 406. Wave form 506 is the conversion status signal at output 356. Wave form 508 is a conversion done signal with a time delay of $T_{D1}$ and is provided by time delay circuit 404. Wave form 510 is the conversion status signal at output 356 when the time period $T_M$ is greater than the time delay $T_{D1}$. The time period $T_M$ is proportional to the conversion margin. The wave form 512 is a conversion done signal with a time delay of $T_{D2}$ and is provided by time delay circuit 404. Wave form 514 is the conversion status signal at output 356 when the time period $T_M$ is less than the time delay $T_{D2}$. The time period $T_M$ is determined using a destructive measurement of the conversion status signal at output 356. For example, the value $T_D$ is varied until the conversion status signal at output 356 flips from 1 to 0 such that the value of the time delay $T_D$ corresponds to time period $T_M$ (see wave form 514). The time delay $T_D$ is provided by the variable time delay circuit 404. In general, the time period $T_M$ and hence the conversion margin varies with the input to SAR ADC 300, system noise and metastable events.

In some embodiments, SAR ADC 300 employs a monitoring scheme that collects the values of the time period $T_M$ or other representations of the conversion margin. The values are collected over time. Values are collected as the time delay is varied in some embodiments. A probability that the time period $T_M$ is greater than a certain value can be calculated for various time delays. When the time period $T_M$ is greater than the time delay $T_D$, a curve of the probability versus time period $T_M$ flattens out, thereby indicating a minimum conversion margin value at that delay. The delay can be used as a minimum conversion margin value which can be used to provide adaptive feedback for SAR ADC 300 as described below.

Figure 6:
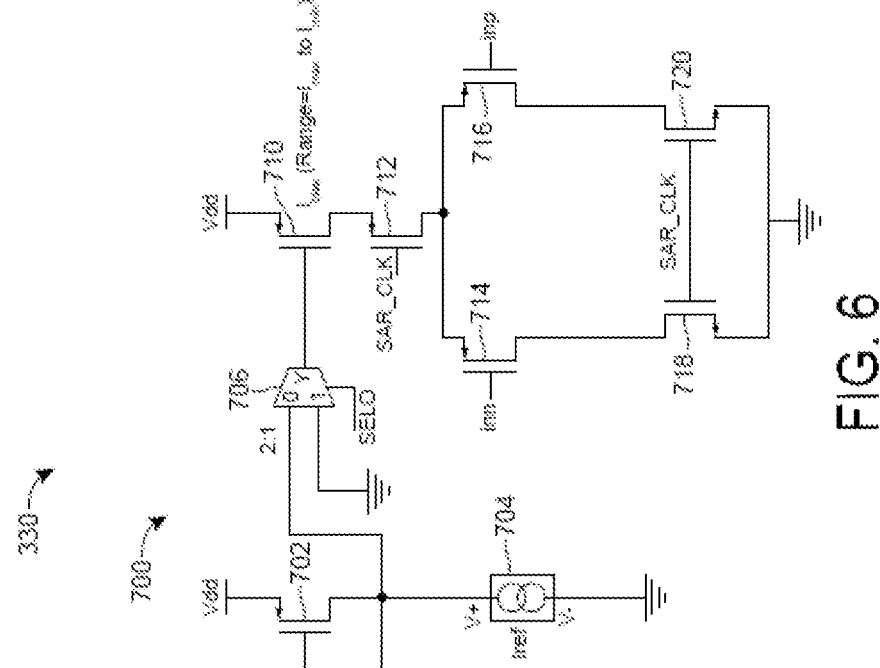
FIG. 6 is a schematic diagram of a current source circuit of the comparator utilized in the SAR ADC illustrated in FIG. 3A, according to one or more embodiments.

With reference to FIG. 6, comparator circuit 330 includes an adjustable current source circuit 700 in some embodiments. Current source circuit 700 includes transistor 702, a current source 704, a multiplexer 706, a transistor 710, and a transistor 712 configured as an adjustable current source for transistors 714, 716, 718, and 720 of the comparator circuit 330. Transistor 712 is driven by the CLK_SAR signal in some embodiments. Transistors 714, 716, 718, and 720 are the first stage of comparator circuit 330, receive the signals at output ports 331 and 332 (FIG. 3), and can be part of a high speed comparator in some embodiments. Transistor 710 is configured to provide a current $I_{bias}$ within a range of $I_{max}$ and $I_{min}$. The value of current $I_{bias}$ is controlled by multiplexer 706 which selects a ground signal or a signal from between transistor 702 and current source 704 based on a selection signal provided to the select input of multiplexer 706. The selection signal is provided by controller 382 in some embodiments. The multiplexer 706 drives transistor 710 in accordance with the selection. For a low speed corner (SS), the current source value is adjusted to $I_{max}$ for high speed in some embodiments. For a high speed corner (FF), the current source value is adjusted to $I_{min}$ for low speed in some embodiments. The selection signal is related to the time period $T_M$ where larger conversion margin indicates lower $I_{bias}$ should be provided by transistor 710 and vice versa.

Figure 7:
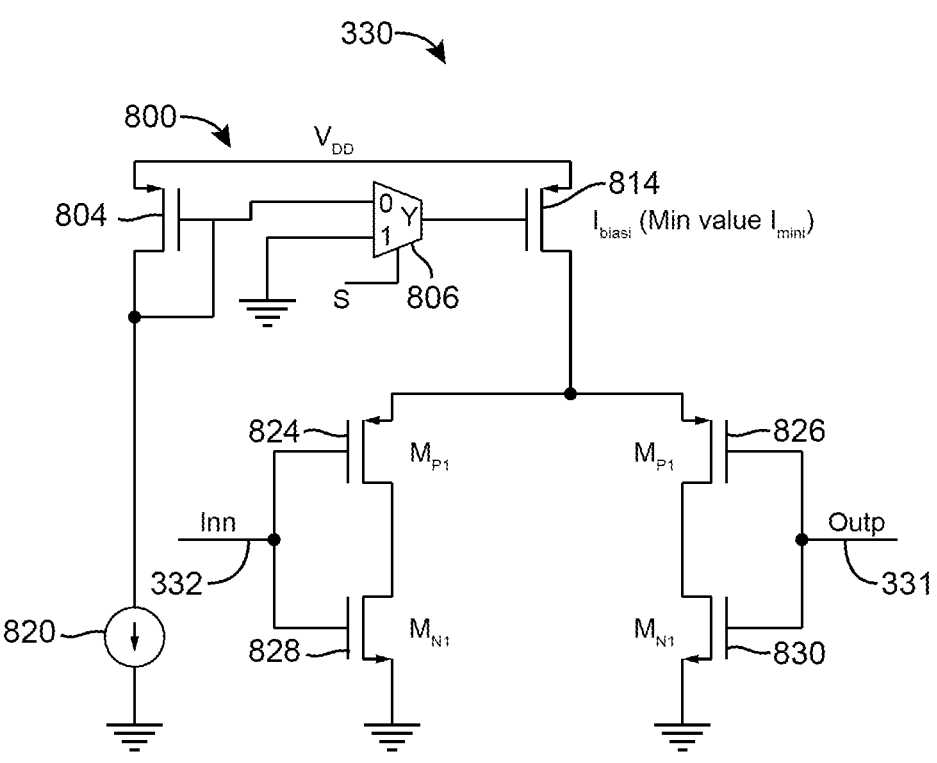
FIG. 7 is a schematic diagram of a comparator driver circuit for the SAR ADC illustrated in FIG. 3A, according to one or more embodiments.

With reference to FIG. 7, comparator circuit 330 includes an adjustable driver circuit 800. Adjustable driver circuit 800 includes a transistor 804, a multiplexer 806, a current source 820, a transistor 814, a transistor 824, a transistor 826, a transistor 828, and a transistor 830. Adjustable driver circuit 800 is an adjustable comparator driver for a high speed comparator and can be provided at outputs 361 and 362 (FIG. 3A) in some embodiments. The value of the current $I_{biasi}$ is controlled by multiplexer 806 which selects a ground signal or a signal from a node between transistor 804 and current source 820 to drive current $I_{biasi}$ for transistors 824, 828, 826, and 830. The select signal at select input of multiplexer 806 is used to tune adaptively the current $I_{biasi}$. The select signal is based upon the conversion margin and can be provided by controller 382 (FIG. 3). The current $I_{biasi}$ through transistor 814 is adjusted to change the current $I_{biasi}$ without affecting speed significantly in some embodiments. The selection signal is related to the time period $T_M$ where larger conversion margin indicates lower $I_{biasi}$ should be provided by transistor 814 and vice versa.

Figure 8:
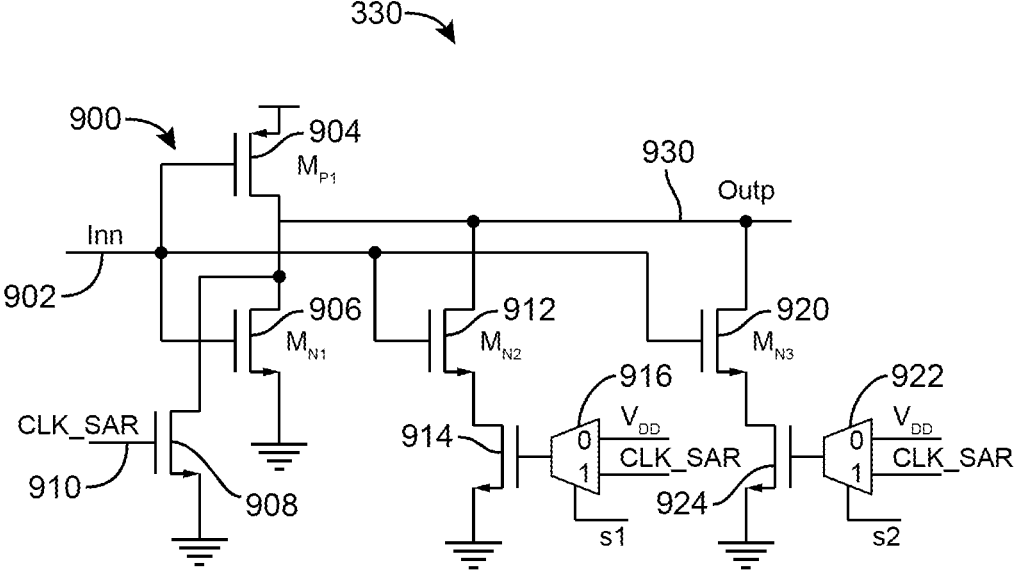
FIG. 8 is a schematic diagram of an alternative comparator driver circuit for the SAR ADC illustrated in FIG. 3A, according to one or more embodiments.

With reference to FIG. 8, comparator circuit 330 can includes an adjustable driver circuit 900. Adjustable driver circuit 900 includes an input 902, a transistor 904, a transistor 906, a transistor 908, a transistor 912, a transistor 914, a multiplexer 916, a transistor 920, a multiplexer 922, a transistor 924, and an output 930. Adjustable driver circuit 900 is configured as an adjustable comparator driver for a high speed comparator and can be provided at outputs 361 and 362 in some embodiments. The value of the driver threshold voltage $V_{th}$ is controlled by multiplexers 916 and 922 which selects a voltage signal VDD or a clock signal (e.g., CLK_SAR) to drive transistor 914 and 924, respectively. The select signals at select inputs of multiplexers 916 and 922 are used to tune adaptively the driver threshold voltage $V_{th}$. The select signals are based upon the conversion margin and can be provided by controller 382 (FIG. 3). The selection signals are related to the time period $T_M$ where a larger conversion margin indicates lower threshold voltage $V_{th}$ should be provided by transistors 914 and 924. In some embodiments, the time period $T_M$ is used to set $V_{DD}$ where a larger conversion margin indicates lower voltage $V_{DD}$ should be provided and vice versa.

With reference to FIG. 9, SAR ADC 300 can perform a flow 1000 to measure statistics or values associated with the conversion status signal (e.g., wave form 506 (FIG. 5)). Flow 1000 is performed to estimate a probability of the conversion status signal being 1 (e.g., wave form 510 as opposed to wave form 514 in FIG. 5). The probability P(CS) can be determined by comparing the conversion margin to a value in some embodiments. The probability is a probability of a successful conversion, and a successful conversion is defined when the conversion margin is greater than a threshold in some embodiments. The value can be a fixed value, a percentage of the sample cycle, etc. The probability can be represented by curves 1106, 1108, and 1110 provided on an X-axis representing conversion margin in time and a Y-Axis representing probability. Curves 1106, 1108, and 1110 are each for a particular time delay (100 picoseconds (ps), 200 ps, 300 ps). The flow 1000 is performed so that SAR ADC 300 operates at the intersection of the linear and flat portion of curves 1106, 1108, and 1110 for a given delay $T_D$, thereby providing a more optimum power, noise, and bit error rate (BER) tradeoff according to some embodiments. Generally, the flat portion of curves 1106, 1108, and 1110 begins when the conversion margin is greater than the time delay $T_D$.

Flow 1000 includes an operation 1002 where the current $I_{bias}$ is adjusted (FIG. 7). If current $I_{bias}$ is greater than $I_{min}$, the probability is estimated in an operation 1004. If the probability is above a threshold (e.g., a percentage above 90 percent (e.g., 0.95)), flow 1000 returns to operation 1002. If the probability is below a threshold (e.g., a percentage above 90 percent (e.g., 0.95)), flow 1000 ends adjustments in operation 1006. If current $I_{bias}$ (FIG. 7) is less than $I_{min}$ (minimum value of adjustable bias current of the comparator circuit 330), the voltage threshold $V_{th}$ (FIG. 9) or the current $I_{biasi}$ (FIG. 8) is adjusted in an operation 1010. The voltage threshold $V_{th}$ or the current $I_{biasi}$ is adjusted to increase speed in operation 1010 in some embodiments. If current $I_{biasi}$ is greater than $I_{mini}$ or the voltage threshold $V_{th}$ is greater than $V_{min}$ (depending on implementation, see FIGS. 8 and 9), the probability is estimated in an operation 1012. If the probability is above a threshold (e.g., a percentage above 90 percent (e.g., 0.95)), flow 1000 returns to operation 1008. If the probability is below a threshold (e.g., a percentage above 90 percent (e.g., 0.95)), flow 1000 ends adjustments in operation 1016. If current $I_{biasi}$ is less than $I_{mini}$ (minimum value of adjustable bias current of the comparator driver) or the voltage threshold $V_{th}$ is less than $V_{min}$ (e.g., maximum NMOS adjustable code of the comparator driver), the voltage signal $V_{DD}$ is adjusted (e.g., lower) in an operation 1020. If the voltage signal $V_{DD}$ is greater than $V_{DDmin}$ (minimum supply voltage for SAR ADC 300), the probability is estimated in an operation 1022. If the probability is above a threshold (e.g., a percentage above 90 percent (e.g., 0.95)), flow 1000 returns to operation 1020. If the probability is below a threshold (e.g., a percentage above 90 percent (e.g., 0.95)), flow 1000 ends adjustments in operation 1026. Flow 1000 can operate operations 1010, 1012, and 1016 for both threshold voltage $V_{th}$ and current $I_{biasi}$ together or sequentially. The order of branch of operations 1002, 1004, and 1006, branch of operations 1010, 1012, 1016, and branch of operations 1020, 1022, and 1026 can be switched in some embodiments.

Flow 1000 can be performed in controller 382. Flow 1000 can include fewer operations, such as operations 1002, 1004 and 1006 or operations 1010, 1012, and 1016, or operations 1020, 1022, and 1026. Flow 1000 can be combined with other operations. The flow 1000 can be implemented in a hardware implementation or software (e.g., firmware implementation) (e.g., provided as part of conversion status circuit 350 or other part or parts of SAR ADC 300). In some embodiments, controller 382 is any type and form of dedicated semiconductor logic or processing circuitry capable of processing or supporting flow 1000. Flow 1000 can include software instructions provided on a non-transitory medium and can be implemented by executing the instructions on controller 382. Flow 1000 can be performed at chip initialization, at power on, and periodically during operation. The conversion margin can be periodically calculate to determine if adjustments need to be made as the SAR ADC 300 operates (e.g., heats up). The flow 1000 can be performed periodically in millisecond time periods (e.g., every 4 milliseconds at start up and every 100-400 milliseconds during operation). In some embodiments, historical values of conversion margin are determined and stored. Large deltas between values can be used to initiate flow 1000. In some embodiments, the conversion margin is indicative of an amount of unused time before a bit error occurs within a sampling cycle.

It should be noted that certain passages of this disclosure can reference terms such as "first" and "second" in connection with devices or operations for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code. Further, certain components may be coupled together with intervening components provided there between.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

The invention claimed is:

1. A device, comprising:
a digital to analog conversion (DAC) circuit comprising a plurality of switches;
a first set of storage circuits configured to provide first bits to the DAC circuit; and
an enable circuit configured to provide enable signals to the storage circuits, wherein a first circuit in the first set of storage circuits is configured to receive one of the enable signals such that the switches reset the DAC circuit in response to the one of the enable signals.

2. The device of claim 1, wherein a first storage circuit in the first set of storage circuits stores a least significant bit of the first bits and receives the one of the enable signals.

3. The device of claim 1, further comprising:
a comparator circuit wherein a second storage circuit in the first set of storage circuits stores a most significant bit of the first bits provided by the comparator circuit and is directly coupled to the comparator circuit.

4. The device of claim 3, wherein a second set of storage circuits comprises all remaining storage circuits in the first set of storage circuits and is coupled to a driver circuit between the comparator circuit and the second set of storage circuits.

5. The device of claim 3, wherein the enable circuit is clocked using an output of the comparator circuit.

6. The device of claim 3, wherein the enable circuit is clocked using clock signal provided by a data flip flop having a data input coupled to the one of the enable signals and a click input coupled to an output of a logic circuit coupled to an output of the comparator circuit.

7. The device of claim 6, wherein the DAC circuit comprises capacitors coupled between an input and the switches.

8. The device of claim 1, wherein the enable circuit is comprised of a set of flip flops.

9. The device of claim 1, wherein the one of the enable signals is an enable zero signal.

10. A device, comprising:
a digital to analog conversion (DAC) circuit configured to receive an input voltage;
a first set of storage circuits configured to store a plurality of first bits corresponding to the input voltage; and
an enable circuit configured to provide enable signals to the first set of storage circuits, wherein the digital to analog conversion (DAC) circuit is reset in response to one of the enable signals.

11. The device of claim 10, wherein the one of the enable signals is an enable zero signal.

12. The device of claim 11, wherein a delay is provided in a reset path associated with reset transistors to ensure that a last conversion is not affected.

13. The device of claim 11, wherein a comparator clock signal for a comparator circuit is disabled using the enable zero signal, the comparator circuit being coupled between the DAC circuit and the first set of storage circuits.

14. The device of claim 10, wherein the enable circuit comprises a plurality of flip flops, the flip flops being clocked by a comparator clock signal.

15. The device of claim 10, further comprising a conversion status circuit and wherein the conversion status circuit uses the one of the enable signals to determine a conversion margin.

16. An analog-to-digital conversion device, comprising:
a first circuit comprising a plurality of transistors and capacitive elements, wherein the first circuit is configured to receive an input signal and a feedback signal; and
a storage circuit configured to provide the feedback signal to the first circuit, wherein the storage circuit comprises a plurality of storage units, wherein the storage units are configured to receive respective enable signals, wherein the first circuit is configured to receive one of the enable signals such that the transistors reset the first circuit in response to the one of the enable signals.

17. The device of claim 16, wherein the storage units are set and reset latches.

18. The device of claim 16, further comprising:

a comparator driver between an output of a comparator circuit and a first set of the storage units, wherein the comparator driver comprises a first driver and second driver, the first driver being coupled to a first input of a first storage unit of the first set of the storage units, and the second driver being coupled to first inputs of a second set of the storage units within the first set of the storage units.

19. The device of claim 18, wherein storage units store first bits, and the first storage unit stores a most significant bit of first bits provided by the comparator circuit and the second set of the storage units comprises all remaining storage units in the first set of the storage units, and the one of the enable signals is provided to a second storage unit in the second set of the storage units, wherein the second storage unit stores a least significant bit of the first bits.

20. The device of claim 16, further comprising an enable circuit configured to provide the respective enable signals to the storage units and the first circuit is an digital to analog conversion (DAC) circuit and the one of the enables signals is provided to gates of the transistors.

* * * * *